(12) United States Patent
Liu (10) Patent No.: US 11,355,632 B2
(45) Date of Patent: Jun. 7, 2022

(54) FOLDED CHANNEL VERTICAL TRANSISTOR AND METHOD OF FABRICATING SAME

(71) Applicant: Avago Technologies International Sales Pte. Limited, Singapore (SG)

(72) Inventor: Qing Liu, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/525,015

(22) Filed: Jul. 29, 2019

(65) Prior Publication Data

US 2021/0036151 A1 Feb. 4, 2021

(51) Int. Cl.
*H01L 29/78* (2006.01)
*H01L 21/762* (2006.01)
*H01L 29/66* (2006.01)

(52) U.S. Cl.
CPC ........ *H01L 29/7827* (2013.01); *H01L 21/762* (2013.01); *H01L 29/66666* (2013.01)

(58) Field of Classification Search
CPC combination set(s) only.
See application file for complete search history.

(56) References Cited

U.S. PATENT DOCUMENTS

2009/0085088 A1* 4/2009 Takaishi ............. H01L 29/7827
257/314
2020/0403065 A1* 12/2020 Lee ................. H01L 21/823885

* cited by examiner

*Primary Examiner* — Suberr L Chi
(74) *Attorney, Agent, or Firm* — Foley & Lardner LLP (57) ABSTRACT

A semiconductor structure includes a substrate having a top surface, pillar structures formed on top of the substrate, a gate conductor, a drain/source region and a source/drain region. Each pillar structure of the pillar structures includes a first end and a second end, and the first end is closer to the substrate than the second end. The gate conductor surrounds each of the pillar structures disposed between the first end and the second end. The drain/source region is at the top surface of the substrate and in contact with the first end of a first pillar structure of the pillar structures, and the source/drain region is at the top surface of the substrate and in contact with the first end of a second pillar structure of the pillar structures.

23 Claims, 10 Drawing Sheets

FOLDED CHANNEL VERTICAL TRANSISTOR AND METHOD OF FABRICATING SAME

FIELD OF THE DISCLOSURE

This disclosure generally relates to a structure for one or more vertical transistors and a method of fabricating one or more vertical transistors including but not limited to one or more vertical transistors with a folded channel path, a longer channel path, or with different channel path lengths from each other.

BACKGROUND OF THE DISCLOSURE

Integrated circuits (ICs) include microprocessors, microcontrollers, static random access memory (RAM), radio frequency circuits, digital logic circuits, other circuits and combinations of those circuits fabricated on a substrate. The ICs include devices such as transistors. As IC devices continue scaling to smaller dimensions, various designs and techniques are employed to improve device performance. Certain vertical transistors have source/drain/source/drain regions that are disposed at opposing ends of a vertically disposed channel region (with respect to a horizontally disposed substrate). Vertical transistors are attractive candidates for scaling to smaller dimensions.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Before turning to the features, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, systems and methods of achieving certain gate lengths or channel length paths in vertical transistor devices are shown according to some exemplary embodiments. In some embodiments, a gate all around (GAA) vertical field effect transistor (FET) provides significant advantages. GAA vertical FETs with different gate lengths or channel path lengths are desirous for different current on and current off ratios (Ion/Ioff). System on chip ICs require devices with varying gate lengths or channel path lengths (e.g., for core and edge devices). In addition, devices having longer gate lengths or channel path lengths are desired. Fabricating vertical FETs with long or longer gate lengths is difficult using conventional designs and fabrication techniques. The gate of a vertical transistor is formed by a deposition and recess process which requires a separate mask in certain processes. Further, longer vertical gate lengths are difficult to form due to aspect ratio issues.

In some embodiments, an advantageous vertical FET (e.g., GAA vertical FET) uses a folded channel path to achieve long gate lengths and/or variable gate lengths. In some embodiments, the folded channel path is formed using a dual depth shallow trench isolation process. In some embodiments, a GAA vertical FET includes pillar structures formed on a top surface of a substrate. Each pillar structure of the pillar structures includes a first end and a second end. The first end is closer to the substrate than the second end. The GAA vertical FET also includes a gate conductor surrounding each of the pillar structures disposed between the first end and the second end, a drain/source region at the top surface of the substrate and in contact with the first end of a first pillar structure of the pillar structures, and a source/drain region at the top surface of the substrate and in contact with the first end of a second pillar structure of the pillar structures.

In some embodiments, a semiconductor structure includes a substrate having a top surface, pillar structures formed on top of the substrate, a gate conductor, a drain/source region and a source/drain region. Each pillar structure of the pillar structures includes a first end and a second end, and the first end is closer to the substrate than the second end. The gate conductor surrounds each of the pillar structures disposed between the first end and the second end. The drain/source region is at the top surface of the substrate and in contact with the first end of a first pillar structure of the pillar structures, and the source/drain region is at the top surface of the substrate and in contact with the first end of a second pillar structure of the pillar structures.

In some embodiments, a method of fabricating a semiconductor structure includes forming semiconductor pillar structures using a substrate, and providing first dopants at a first side of one semiconductor pillar structure of the semiconductor pillar structures and another semiconductor pillar structure of the semiconductor pillar structures into the substrate. The method also includes providing a first barrier layer above a surface of the substrate, and providing a gate conductor layer above the first barrier layer and surrounding the semiconductor pillar structures. The method also includes providing a second barrier layer above the gate conductor layer, and providing a doped semiconductor region above the second barrier layer. The doped semiconductor region contacting a first end of two semiconductor pillar structures of the semiconductor pillar structures.

In some embodiments, a circuit includes a first vertical transistor. The first vertical transistor includes a first folded channel comprising first pillar structures formed above a surface of the substrate, a first gate conductor surrounding each of the first pillar structures, a source/drain region and a drain/source/drain region. The first folded channel includes a first path through the first pillar structures coupled in series. The first gate conductor surrounds each of the first pillar structures. The first drain/source region is disposed at the surface of the substrate and in contact with one of the first pillar structures, and a first source/drain region disposed at the surface of the substrate and in contact with another of the first pillar structures.

Figure 1:
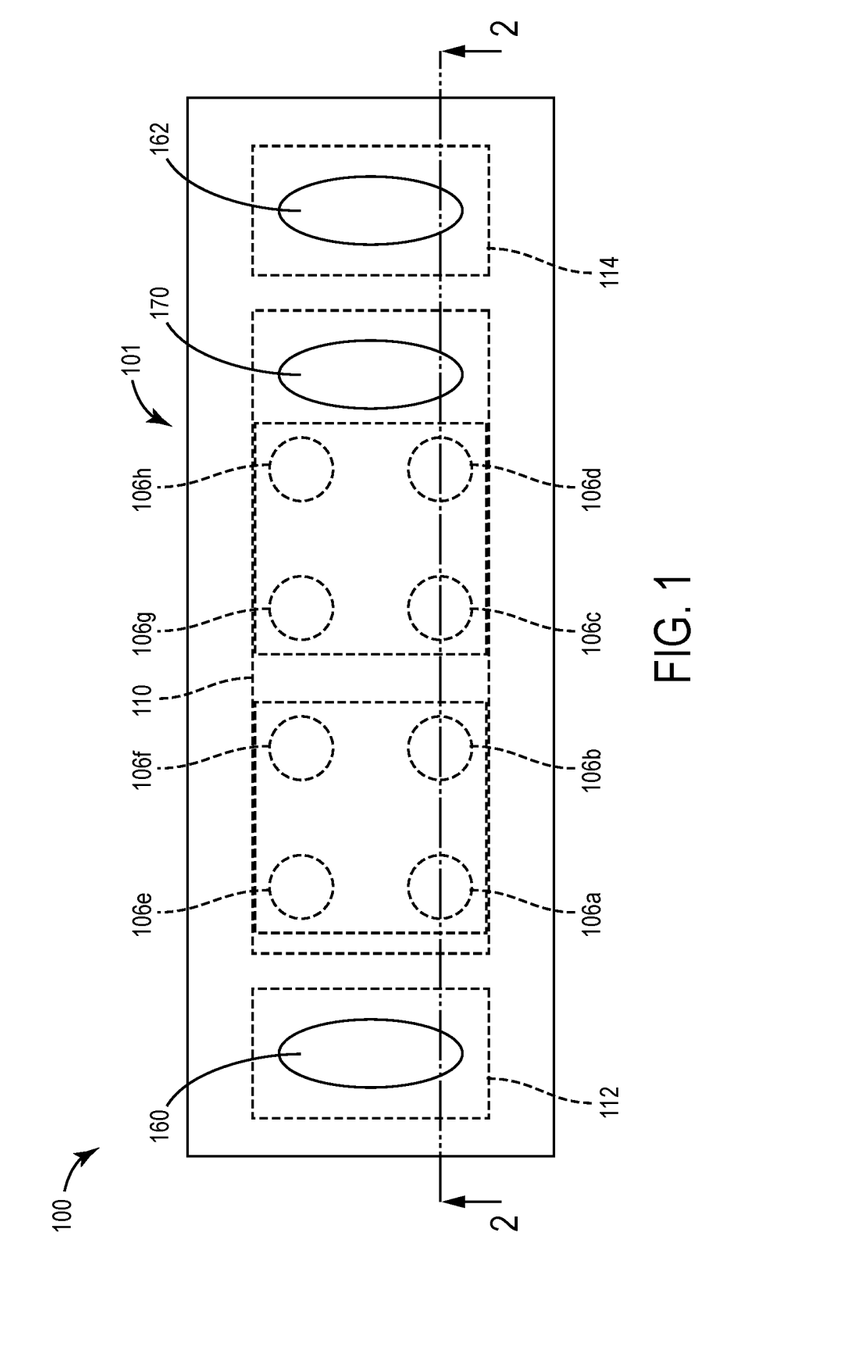
FIG. 1 is a top view schematic drawing of a portion of a semiconductor structure including a substrate according to some embodiments.
Figure 2:
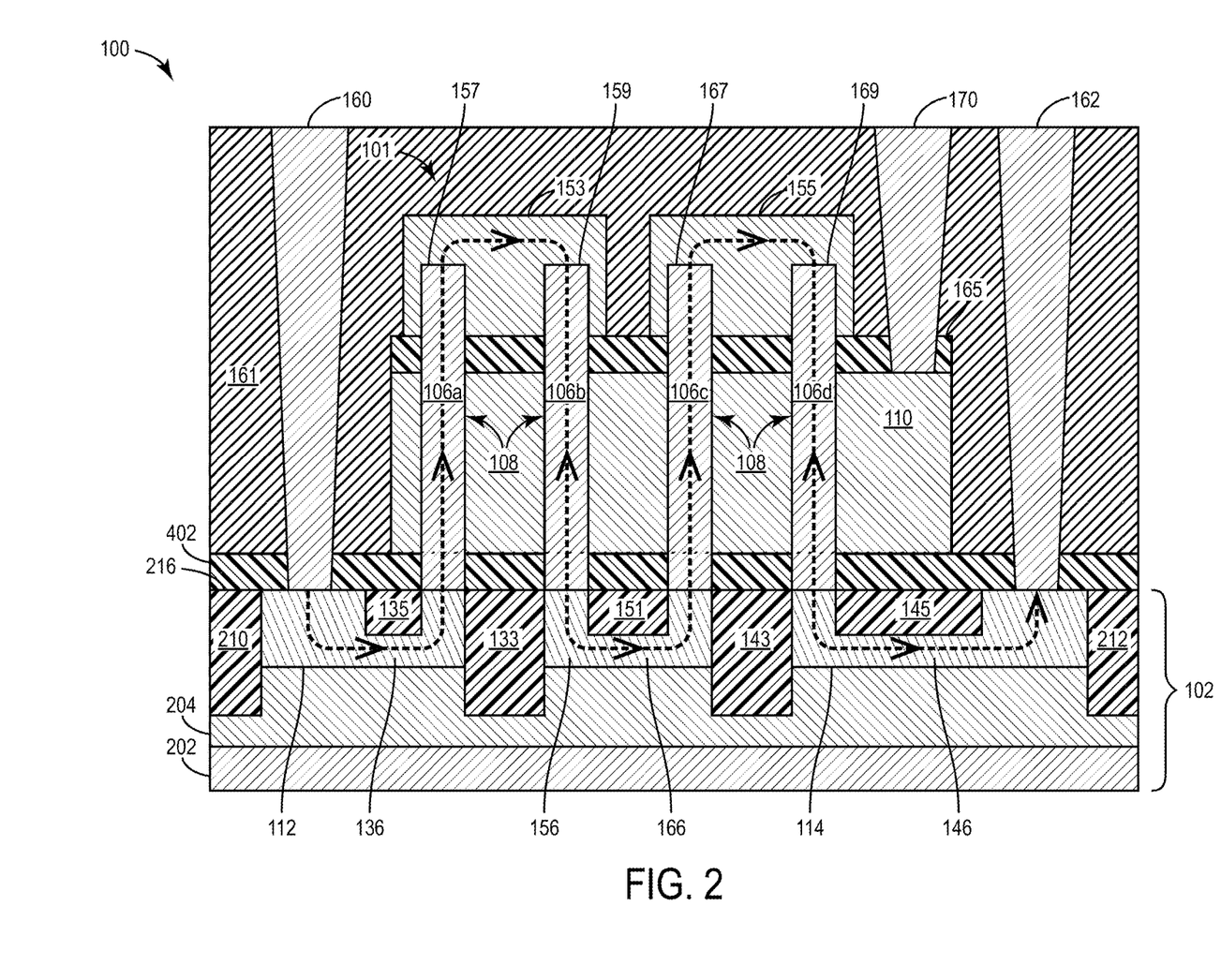
FIG. 2 is a cross-sectional view schematic drawing of the portion of the semiconductor structure illustrated in FIG. 1 about line 2-2 according to some embodiments.

With reference to FIGS. 1 and 2, a portion of a semiconductor structure 100 includes at least one transistor 101 disposed on and or partially within a substrate 102 (FIG. 2). The transistor 101 includes a gate 110, a drain/source 112, a drain/source 114, and a channel 108 (FIG. 2) according to some embodiments. The channel 108 (FIG. 2) is formed at least in part using pillars 106*a*, 106*b*, 106*c*, 106*d*, 106*e*, 106*f*, 106*g*, and 106*h*. The position, characteristics, and sizes of the drain/sources 112 and 114 can be adjusted in some embodiments. The term "drain/source" and "source/drain" refers to a source or a drain in some embodiments.

The transistor 101 is a vertical transistor coupled to other devices on the substrate 102 in some embodiments. In some embodiments, the substrate 102 includes additional vertical transistors (e.g., GAA vertical FETS) similar to the transistor 101 and some of the vertical transistors have different gate or channel lengths than the transistor 101 via a shorter or longer folded channel for achieving different current on and current off ratios (Ion/Ioff). Shorter or longer channels can be achieved by using more or less pillars 106*a*, 106*b*, 106*c*, 106*d*, 106*e*, 106*f*, 106*g*, and 106*h*.

The number of pillars 106*a-h* can be any number depending on desired transistor characteristics. The channel 108 can include multiple sets of pillars 106*a-h* in parallel and/or series to provide gate lengths or channel path lengths of certain sizes and certain electrical characteristics (e.g., resistance and current capacity). In some embodiments, the channel 108 includes from 2 to 8 pillars 106 *a-h*. The channel 108 is configured as a folded channel with a path that has current traveling in both upwards and downward directions in some embodiments. Gate lengths for the transistor 101 can have a different gate length or channel path length according to device parameters by using more or less pillars 106*a-h* according to some embodiments. Shorter gate lengths are used in core devices on the substrate 102 and longer gate lengths are used in edge devices on the substrate 102 according to some embodiments.

For example, as shown in FIG. 2, the drain/source 112, drain/source 114, the gate 110, and the channel 108 are disposed in and/or above the substrate 102 according to some embodiments. The gate 110 is disposed on sides (e.g., all four sides) of each of the pillars 106 *a-h* (FIG. 1). The pillar 106*a* is coupled to the drain/source 112 between a deep trench isolation region 133 and a shallow trench isolation region 135 according to some embodiments. The pillar 106*d* is coupled to the drain/source 114 between a deep trench isolation region 143 and a shallow trench isolation region 145 according to some embodiments. The channel 108 extends in a folded path from the drain/source 112 and to the drain/source 114 via pillars 106*a-h*, highly doped regions 156, 153, and 155 according to some embodiments. The shallow trench isolation regions 151 and 135 and 145 extend the path length (e.g., into the substrate 102 and around the shallow trench isolation regions 151 and 135 and 145 at channel region portions 136, 146 and 166) for the channel 108 and are optional in some embodiments. Ends 157 and 159 of pillars 106*a* and 106*b* are coupled together via the region 153, and ends 167 and 169 of pillars 106*c* and 106*d* are coupled together via the region 155.

A drain/source contact 160 extends through an insulation layer 161 and a spacer layer 402 to the drain/source 112. A drain/source contact 162 extends through the insulation layer 161 and the spacer layer 402 to the drain/source 114. A gate contact 170 extends through the insulation layer 161 through a spacer 165 to the gate 110.

The substrate 102 includes a substrate 202 (e.g., undoped silicon) including a well region 204 of a first polarity. The transistor 101 is provided between deep trench isolation regions 210 and 212 which extend into the well region 204 similar to the regions 133 and 143. The shallow trench isolation regions 135, 151, and 145 do not extend into the well region 204 in some embodiments. The drain/source 112, region 156, and drain/source 114 are provided at a top surface 216 of the substrate 102 and are heavily doped with dopants having an opposite polarity to the dopants used for the well region 204 in some embodiments.

An exemplary process for fabricating the semiconductor structure 100 is described below with reference to FIGS. 1-9 according to some embodiments. Although eight pillars 106*a-h* are shown in FIG. 1, the formation of four pillars 106*a-d* is described below for simplicity. Any number of pillars 106*a-h* can be formed according to some embodiments.

Figure 3:
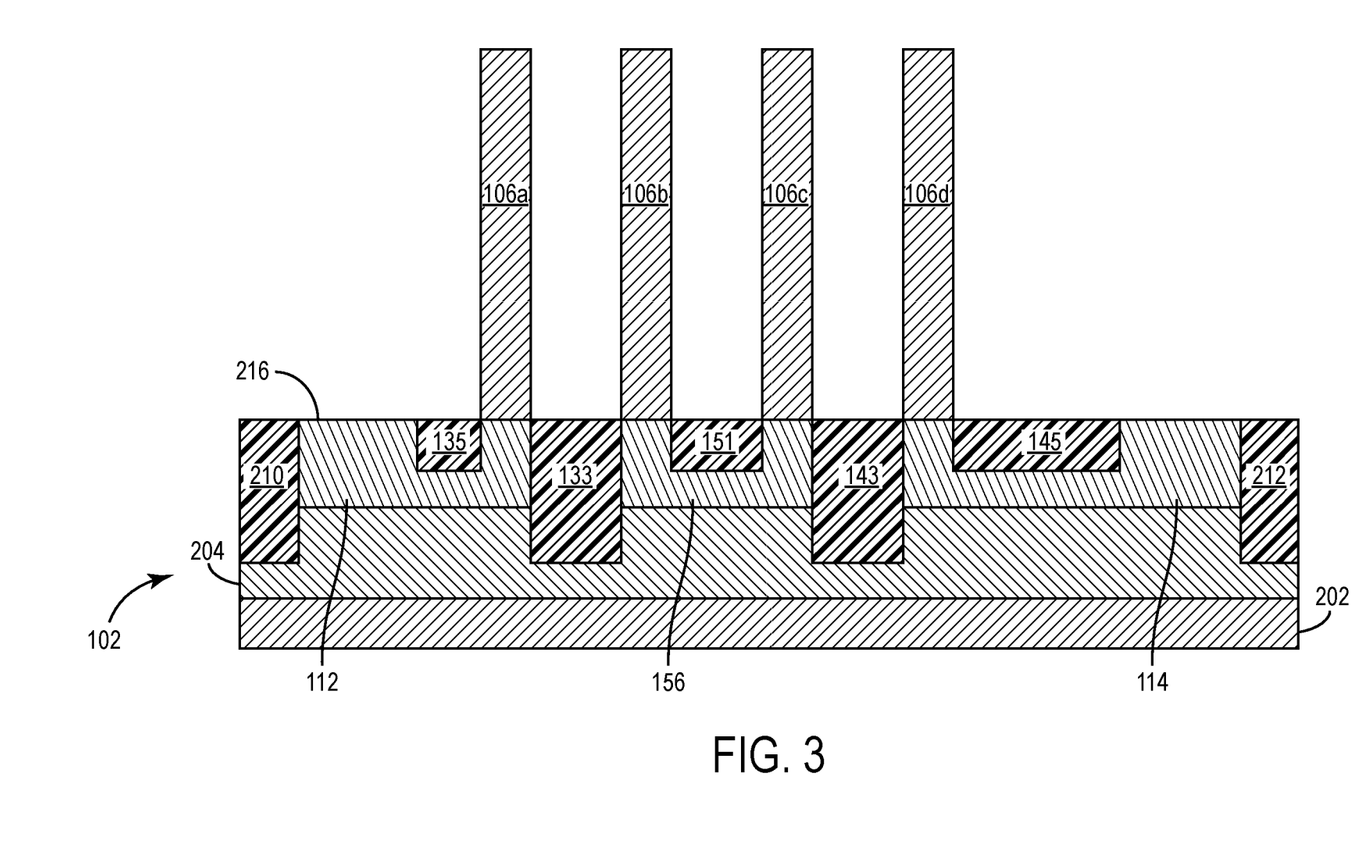
FIG. 3 is a cross-sectional view schematic drawing of the portion of the semiconductor structure illustrated in FIG. 1 about line 2-2 after forming doped regions in the substrate, forming trench isolation regions in the substrate, forming pillar structures, and forming oxide side walls on the pillar structures according to some embodiments.

With reference to FIG. 3, the deep trench isolation regions 210, 133, 143, and 212 are formed in the substrate 102 after the well region 204 is formed by ion implantation. The deep trench isolation regions 210, 133, 143, and 212 are formed by a trench etch and fill process and have a depth from 50-80 nanometers (nm) deep (below the top surface 216 in some embodiments. The substrate 102 can include an insulation layer below the well region 204 in some embodiments. The drain/sources 112, and 114 and the doped region 156 are formed using an inverse mask of the mask used for the deep trench isolation process using an ion implantation technique to form highly doped regions of opposite polarity to the well region 204.

The shallow isolation regions 135, 151, and 145 are formed by a trench etch and fill process and have a depth from 40-70 nm deep in some embodiment. In some embodiments, the depth difference between the shallow isolation regions 135, 151, and 145 and the deep trench isolation regions 210, 133, 143, and 212 is between 5 and 20 nm in some embodiment. In some embodiments, the deep trench isolation regions 210, 133, 143, and 212 and shallow isolation regions 135, 151, and 145 are formed before the pillars 106 *a-h* are formed.

After the shallow trench isolation regions 135, 151, and 145, are formed, a semiconductor layer (e.g., silicon, silicon-germanium, or other semiconductor or compound thereof) is deposited or grown above the top surface 216 and etched to form the pillars 106a-h. The semiconductor layer is a 40-80 nm thick layer epitaxially grown layer or a layer deposited by chemical vapor deposition. A hard mask layer is formed on top of the semiconductor layer by chemical vapor deposition followed by a lithography patterning and etching process to leave a pillar cap according to some embodiments. The hard mask layer can be formed using any suitable material, such as, for example, a nitride or silicon nitride and be deposited by a deposition process including, but not limited to chemical vapor deposition (CVD), physical vapor deposition (PVD), plasma enhanced CVD, atomic layer deposition (ALD), evaporation, chemical solution deposition, or like processes according to some embodiments. The pillar cap is used as a mask to etch the semiconductor layer to form the pillars 106 *a-d* and defines the width of the pillars 106a-h.

In some embodiments, the hard mask layer is patterned using an oxide process to achieve pillar widths smaller than conventional lithographic techniques (e.g., to provide narrower pillars 106a-h). The hard mask layer is coated with a polysilicon or amorphous silicon layer which is lithographically patterned to leave a mask. The polysilicon or amorphous silicon layer can be deposited by a deposition process including, but not limited to chemical vapor deposition (CVD), physical vapor deposition (PVD), plasma enhanced CVD, atomic layer deposition (ALD), evaporation, chemical solution deposition, or like processes according to some embodiments. A shallow trench isolation process is provided over the mask leaving oxide sidewalls or shallow trench isolation spacers on the mask. The spacers can include an insulating material, for example, silicon dioxide, silicon nitride, SiOCN, or SiBCN according to some embodiments. The mask is removed and the spacers or oxide sidewalls are used as a mask to etch the semiconductor layer and define the width of the pillars 106a-h.

The semiconductor layer is subjected to one or more of anisotropic dry etches, such as reactive-ion etching (ME) or a plasma etching process that patterns the semiconductor layer to form the pillars 106a-h according to the oxide/spacer mask or the hard mask. The pillars have a height of 40-110 nm (e.g., 50 nm), a width (e.g., right to left in FIG. 3) of 7-20 nm in some embodiments in some embodiments and a depth of 70-100 nm in some embodiments. A gate dielectric material is a material, such as, high K dielectric, oxides, nitrides, oxynitrides, silicates (e.g., metal silicates), aluminates, titanates, nitrides, or any combination thereof is grown or otherwise formed on the sidewalls of the pillars 106 *a-h* in some embodiments. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

In some embodiments, the pillars 106a-h are formed in the substrate 102 before or when the deep trench isolation regions 210, 133, 143, and 212 and the shallow trench isolation regions 135, 151, and 145 are formed. The substrate 102 is etched to form trenches for the deep trench isolation regions 210, 133, 143, and 212 which are partially filled with oxide to leave the pillars 106a-h extending above the deep trench isolation regions 210, 133, 143, and 212 and the shallow trench isolation regions 135, 151, and 145 in some embodiments. The shallow trench isolation regions 135, 151 and 145 are formed after the regions 210, 133, 143, and 212 in some embodiments.

In some embodiments, the substrate 102 can be formed using any suitable material, such as silicon, silicon germanium, germanium, etc. The substrate 102 can include other structures (not shown) such as isolation, doped wells that can be formed by implantation and doping techniques. The depth or height of the pillars 106a-h is controlled by process selection in some embodiments.

Figure 4:
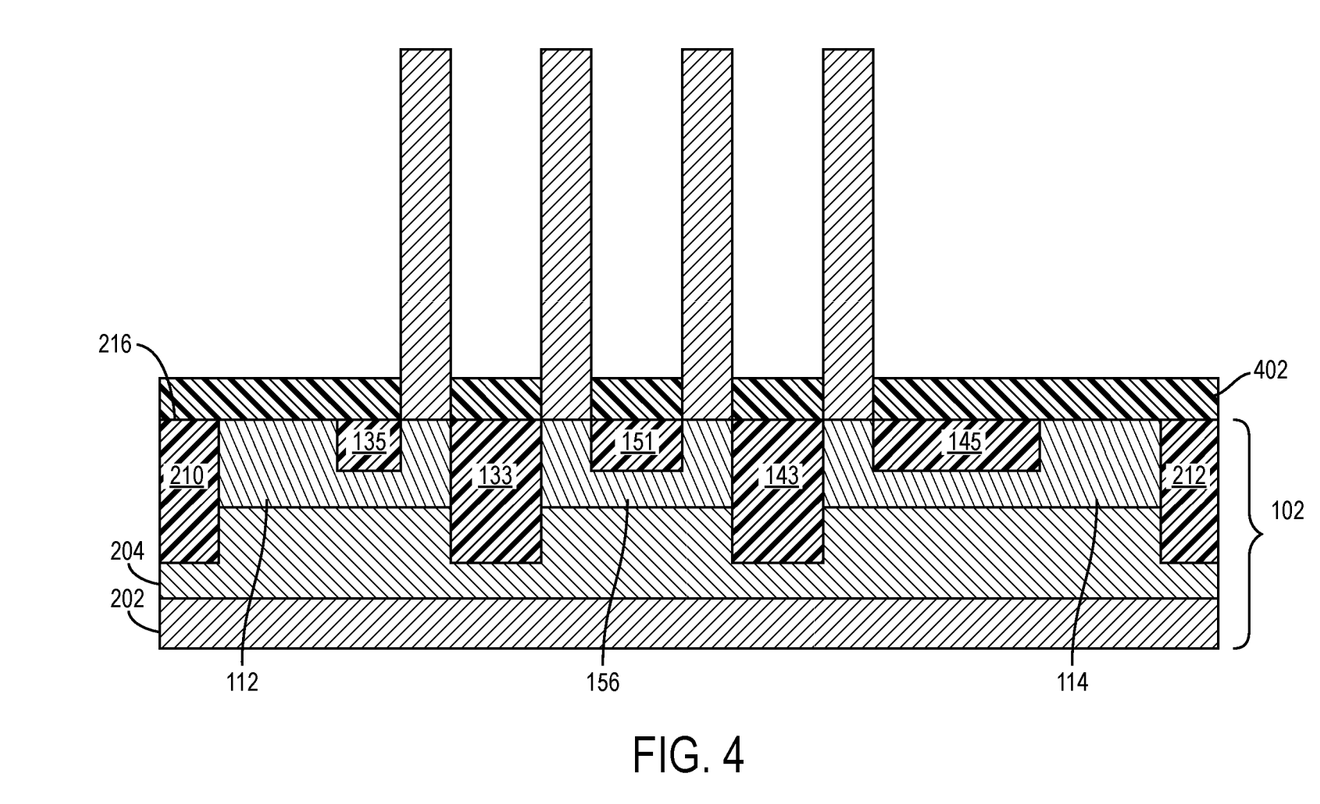
FIG. 4 is a cross-sectional view schematic drawing of the portion of the semiconductor structure illustrated in FIG. 1 about line 2-2 after providing a first spacer layer according to some embodiments.
Figure 5:
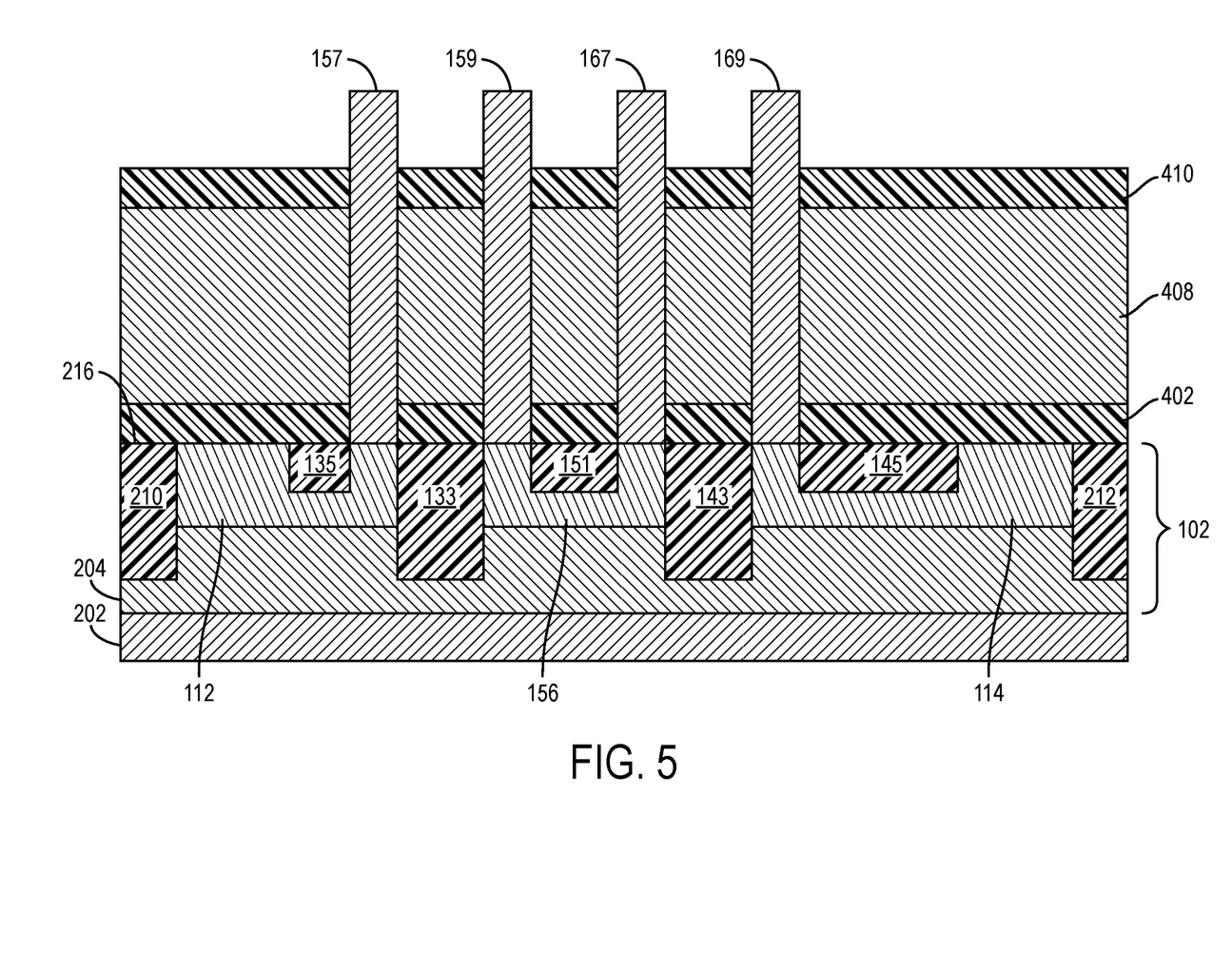
FIG. 5 is a cross-sectional view schematic drawing of the portion of the semiconductor structure illustrated in FIG. 1 about line 2-2 after providing a gate conductor layer and a second spacer layer according to some embodiments.
Figure 6:
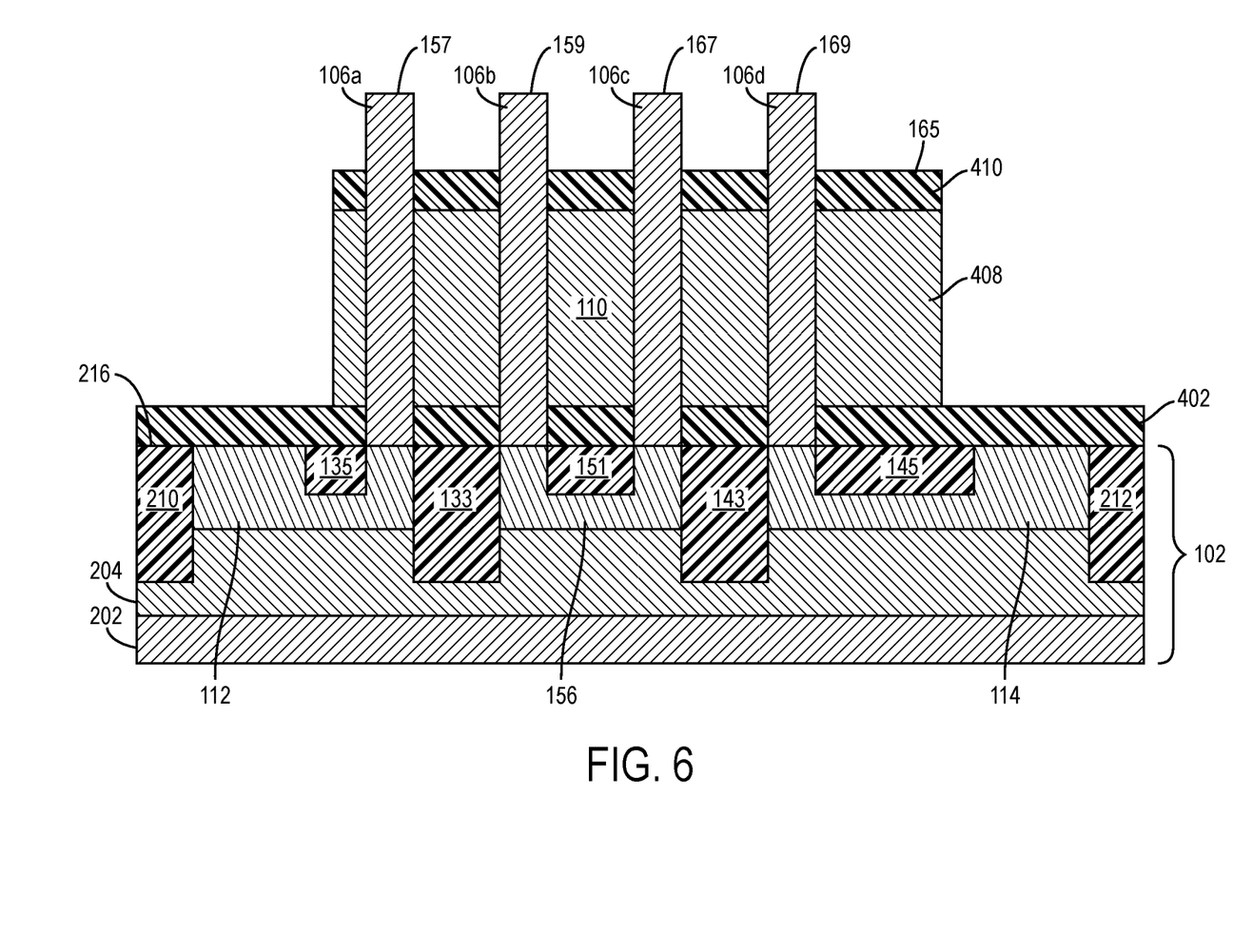
FIG. 6 is a cross-sectional view schematic drawing of the portion of the semiconductor structure illustrated in FIG. 1 about line 2-2 after etching the gate conductor layer and the second spacer layer according to some embodiments.

With reference to FIG. 4, a spacer layer 402 is provided above the top surface 216 of the substrate by chemical vapor deposition. The spacer layer 402 is 5-10 nm thick and can be a silicon nitride material or other suitable spacer material. With reference to FIG. 5, a gate conductor layer 408 and a spacer layer 410 are provided above the spacer layer 402. The spacer layer 410 is 5-10 nm thick and can be a silicon nitride material or other suitable spacer material, and the gate conductor layer 408 is a 20-40 nm thick layer of conductive material such as aluminum, alloys thereof, doped polysilicon, or other suitable gate material. Ends 157, 159, 167, and 169 of the pillars 106a-d are exposed. With reference to FIG. 6, the spacer layer 410 and the gate conductor layer 408 are masked and etched to leave the gate 110 and spacer 165 surrounding the pillars 106a-d and not above the drain/sources 112 and 114 in some embodiments.

Figure 7:
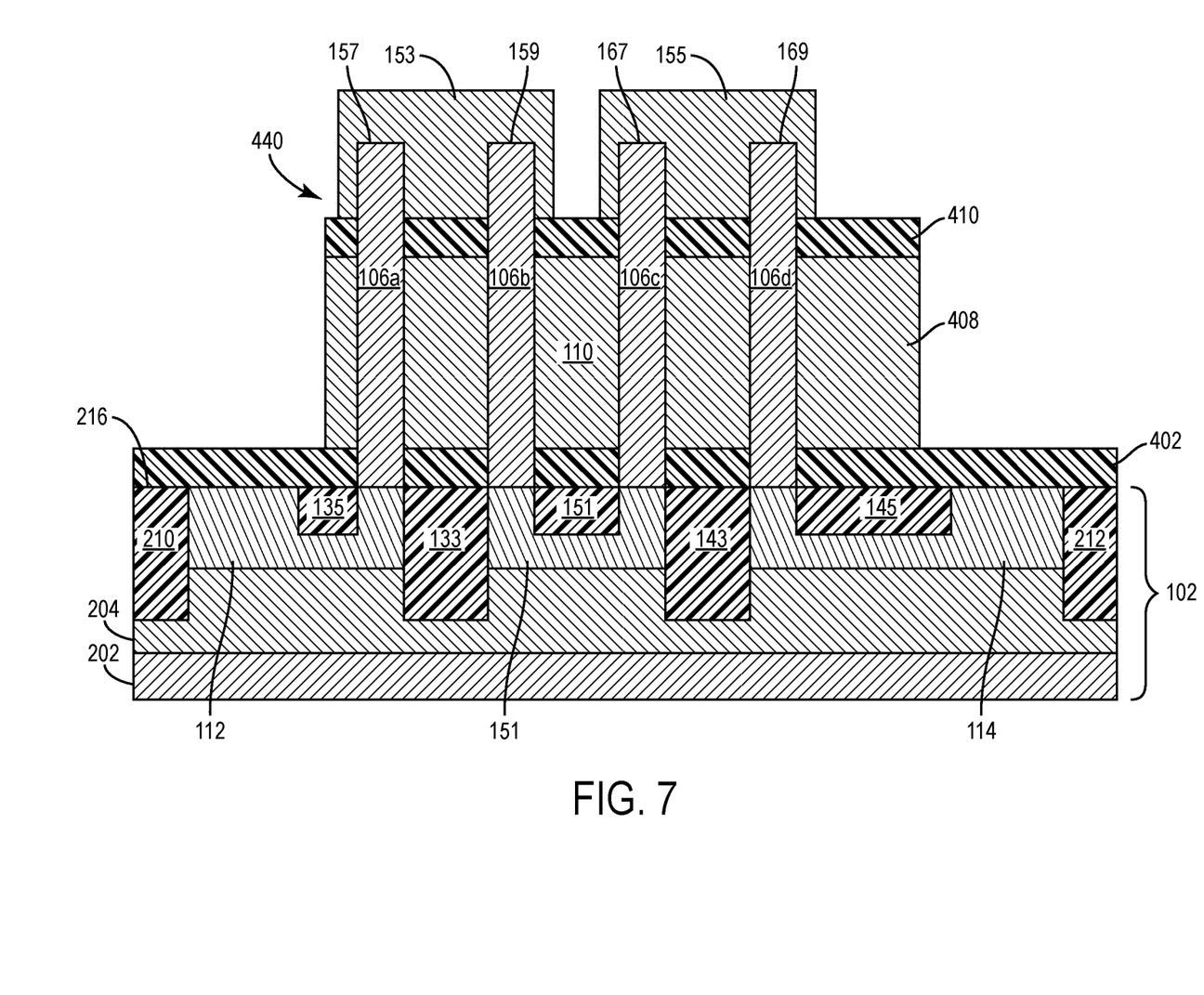
FIG. 7 is a cross-sectional view schematic drawing of the portion of the semiconductor structure illustrated in FIG. 1 about line 2-2 after providing a pillar connect layer according to an alternative technique according to some embodiments.
Figure 8:
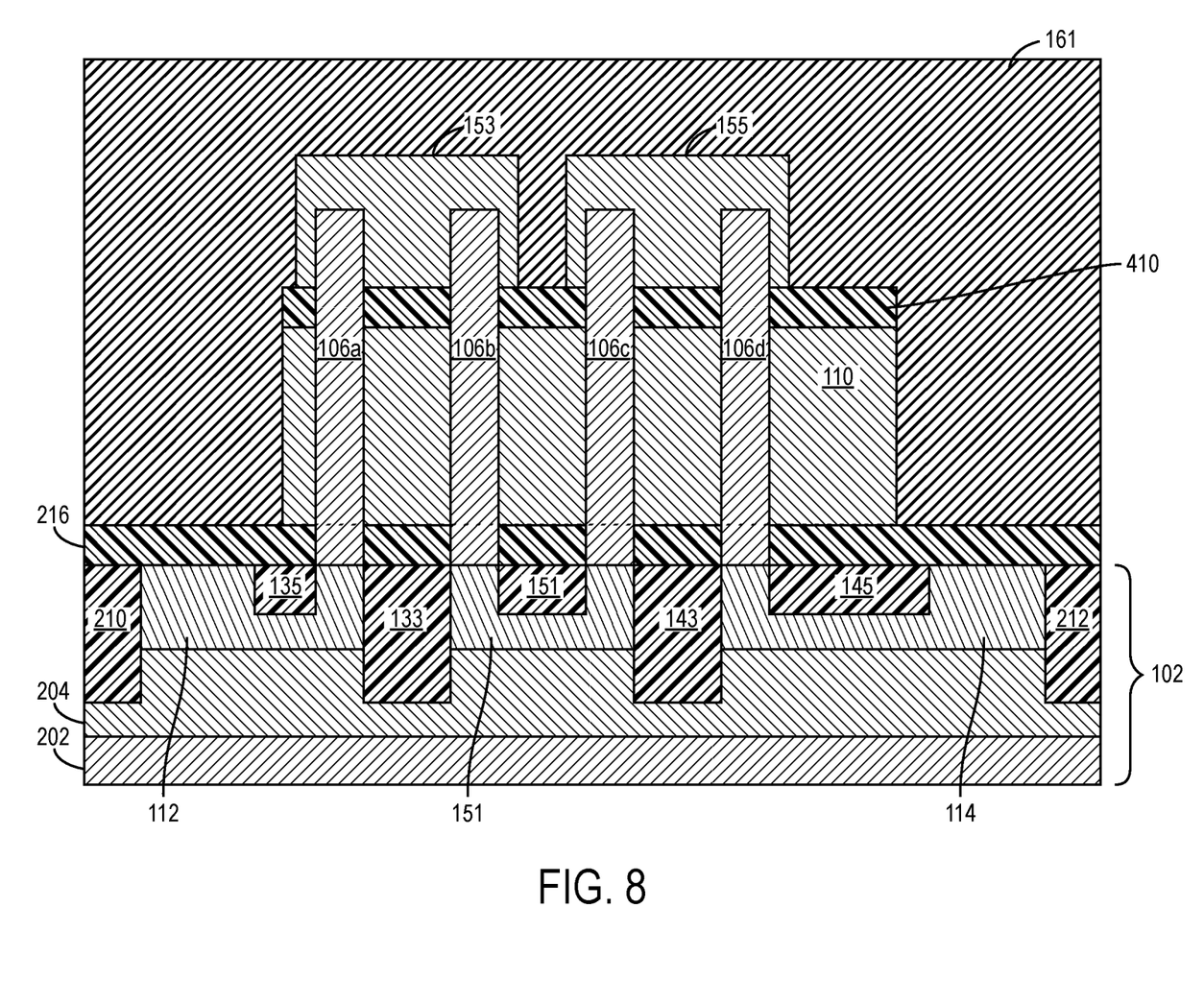
FIG. 8 is a cross-sectional view schematic drawing of the portion of the semiconductor structure illustrated in FIG. 1 about line 2-2 after providing an interlevel dielectric layer and holes for conductive vias.

With respect to FIG. 7, the highly doped regions 153 and 155 are provided to connect the ends 157, 159, 167, and 169 of the pillars 106 *a-b* and 106c-d respectively. The highly doped regions 151 and 155 are epitaxially grown and doped in situ in some embodiments. With respect to FIG. 8, an insulation layer 151 is provided over the regions 153 and 155 in some embodiments. In some embodiments, the layer 151 is provided before the regions 153 and 155 and then etched to expose the ends 157, 159, 167, and 169 and reach the spacer layer 410. After etching, the regions 153 and 155 are provided and covered with insulating material to complete the insulation layer 161.

Figure 9:
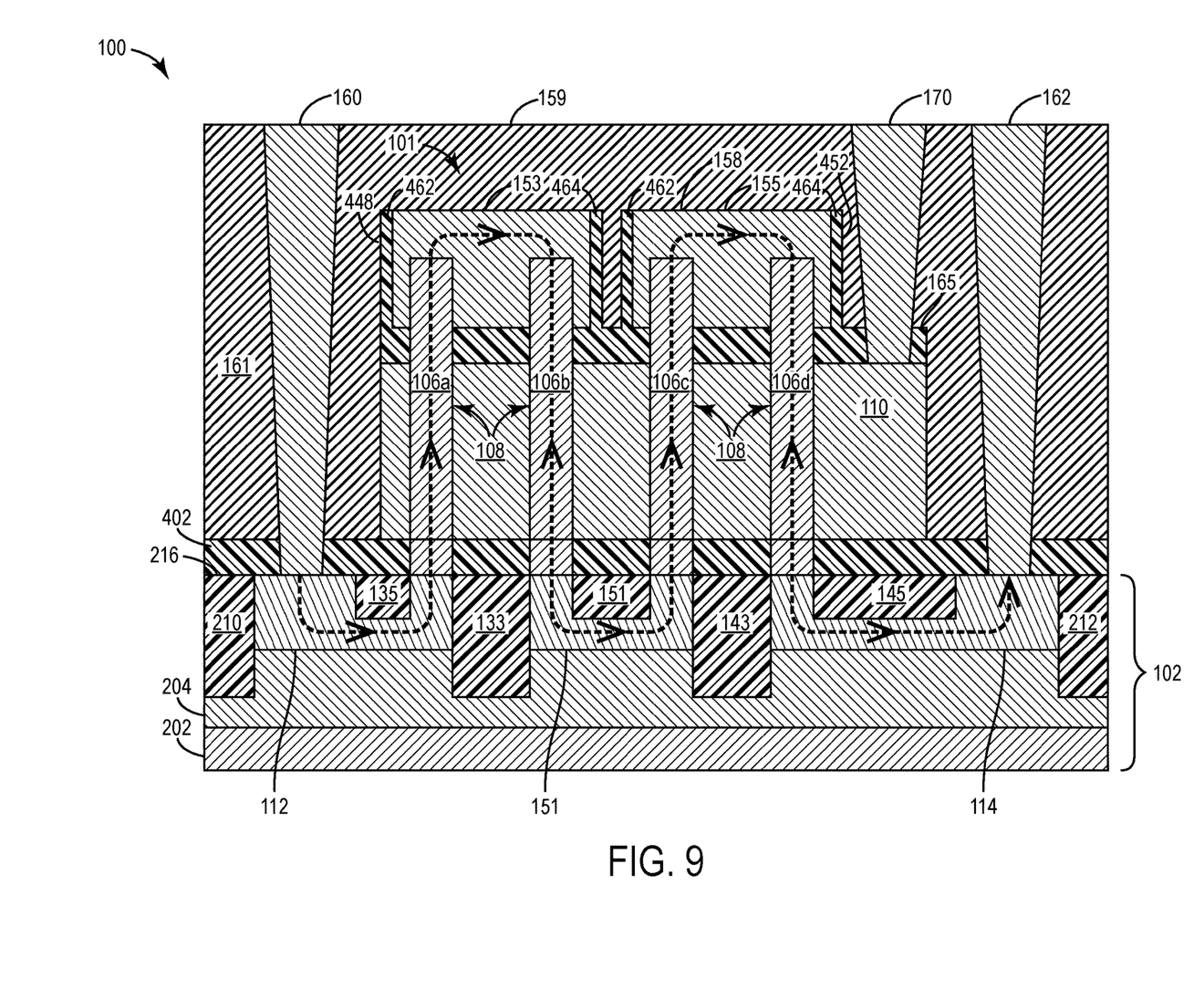
FIG. 9 is a cross sectional view schematic drawing of a portion of another semiconductor structure including inner spacers according to some embodiments.

With reference to FIG. 9, spacers 462 and 464 can be formed before the regions 153 and 155 are provided in aperture 448 and 452 associated with the etching of the layer 151. The material for the spacers 462 and 464 can be the same as the material for the spacer layer 410. The spacers 462 and 464 confine the regions 153 and 155 during epitaxial growth in some embodiments.

With reference to FIG. 2, the vias for the drain/source contacts 160 and 162 and the gate contact 170 are formed to connect to the drain/source region 112, the gate 110 and the drain/sources 114, respectively.

Figure 10:
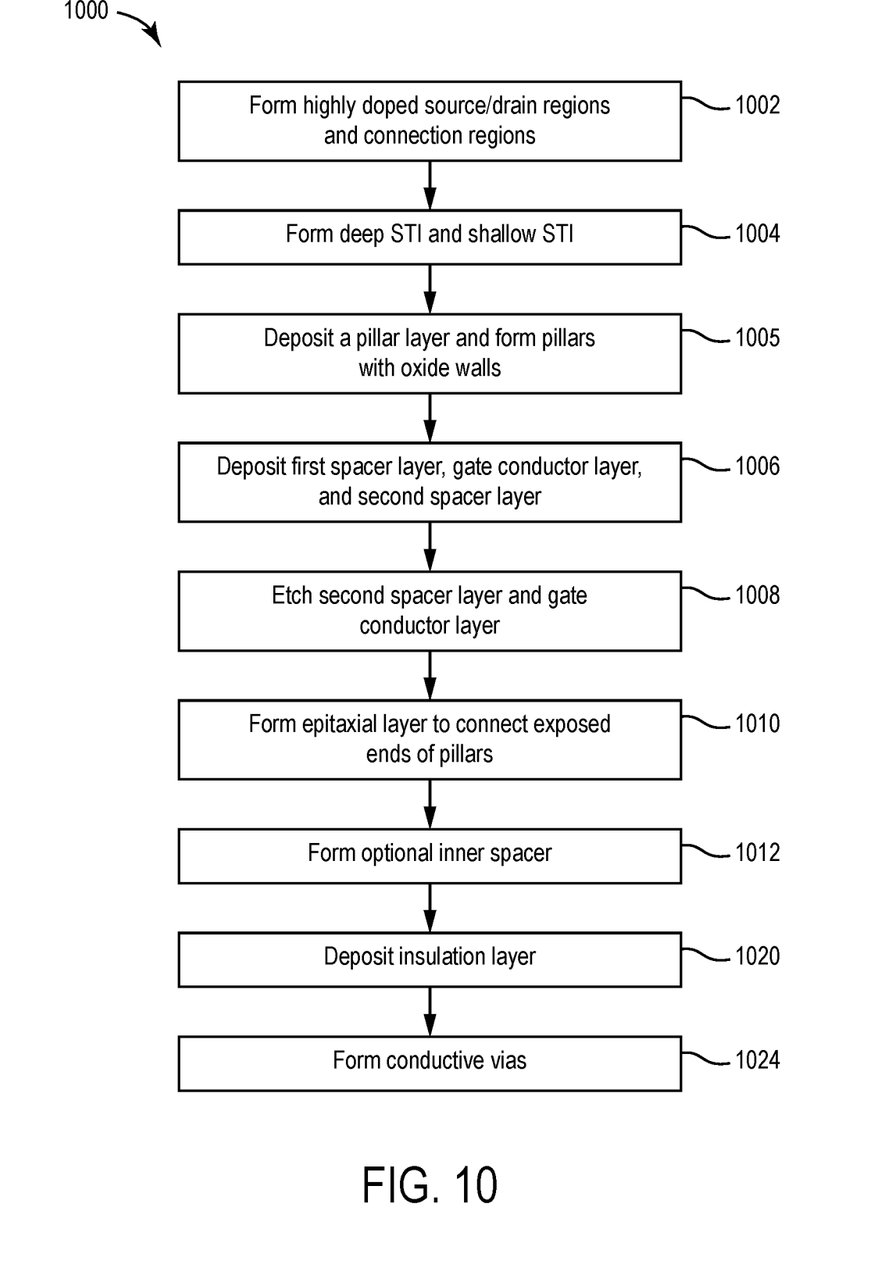
FIG. 10 is a flow diagram showing operations for fabricating a portion of semiconductor structure according to some embodiments.

With respect to FIG. 10, a flow 1000 for fabricating a semiconductor structure with a folded channel is shown according to some embodiments. At an operation 1002, the highly doped region 156 and the drain/sources 112 and 114 are formed in the substrate 102 according to some embodiments. At an operation 1004, the shallow trench isolation regions 135, 151, and 145 and the deep trench isolation regions 210, 133, 143, and 212 are formed in the substrate 102 according to some embodiments. At an operation 1005, the pillars 106a-h are formed on a layer above the substrate 102. In some embodiments, the pillars 106a-h are formed before operations 1002 and 1004. In the operation 1005, oxide side walls can be formed on the on the pillars 106a-h as a gate dielectric material according to some embodiments.

At an operation 1006, the spacer layer 402, the gate conductor layer 408, and the second spacer layer 410 are deposited. At an operation 1008, the second spacer layer 410 and the gate conductor layer 408 are selectively etched to leave the gate 110 according to some embodiments. At an operation 1010, an epitaxial layer associated with the regions 153 and 155 is grown to connect the ends 157, 159 and the ends 167 and 169. At an operation 1012, optional spacers 464 and 462 (FIG. 9) can be formed. The spacers 462 and 464 can be formed on sidewalls defining the regions 153 and 155 of the insulation layer 161 deposited and etched before the operation 1010 in some embodiments. At an operation 1020, the insulation layer 161 is completed. At an operation 1024, the vias for the drain source contacts 160 and 162 and the gate contact 170 are formed through the insulation layer 161 to connect to the drain/source region 112, the gate 110 and the drain/sources 114, respectively.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with devices for purposes of identifying or differentiating one from another or from others. These terms are not intended to relate entities or operations (e.g., a first region and a second region) temporally or according to a sequence, although in some cases, these entities can include such a relationship. Nor do these terms limit the number of possible entities or operations. Further, the term drain/source region refers to a source/drain region, a drain/source/drain region, or a region that can be used as a source or a drain.

It should be understood that the circuits described above can provide multiple ones of any or each of those components. In addition, the structures, circuits and methods described above can be adjusted for various system parameters and design criteria, such as shape, depth, thicknesses, etc. Although shown in the drawings with certain components directly coupled to each other, direct coupling is not shown in a limiting fashion and is exemplarily shown. Alternative embodiments include circuits with indirect coupling between the components shown.

It should be noted that although the flowcharts provided herein show a specific order of method steps, it is understood that the order of these steps can differ from what is depicted. Also two or more steps can be performed concurrently or with partial concurrence. Such variation will depend on the software and hardware systems chosen and on designer choice. It is understood that all such variations are within the scope of the disclosure.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A semiconductor structure, comprising:
   a substrate having a top surface;
   a plurality of pillar structures formed on top of the substrate, each pillar structure of the plurality of pillar structures comprises a first end and a second end, wherein the first end is closer to the substrate than the second end;
   a channel path disposed through the plurality of pillar structures and underneath a shallow trench isolation region in the substrate;
   a gate conductor surrounding each of the plurality of pillar structures disposed between the first end and the second end;
   a drain/source region at the top surface of the substrate and in contact with the first end of a first pillar structure of the plurality of pillar structures; and
   a source/drain region at the top surface of the substrate and in contact with the first end of a second pillar structure of the plurality of pillar structures.

2. The semiconductor structure of claim 1, wherein the gate conductor encircles the plurality of pillar structures.

3. The semiconductor structure of claim 1, further comprising:
   a deep isolation region disposed in the substrate, wherein the deep isolation region is between the first pillar structure and the second pillar structure.

4. The semiconductor structure of claim 1, further comprising:
   a shallow isolation region disposed in the substrate, wherein the shallow isolation region is between a drain via and the first pillar structure.

5. The semiconductor structure of claim 1, wherein the gate conductor does not surround a top and a bottom of each of the plurality of pillar structures.

6. The semiconductor structure of claim 1, wherein the gate conductor is a unitary gate conductor encircling each of the plurality of pillar structures disposed between the first end and the second end.

7. A semiconductor structure, comprising:
   a substrate having a top surface;
   a plurality of pillar structures formed on top of the substrate, each pillar structure of the plurality of pillar structures comprises a first end and a second end, wherein the first end is closer to the substrate than the second end;
   a gate conductor surrounding each of the plurality of pillar structures disposed between the first end and the second end;
   a drain/source region at the top surface of the substrate and in contact with the first end of a first pillar structure of the plurality of pillar structures;
   a source/drain region at the top surface of the substrate and in contact with the first end of a second pillar structure of the plurality of pillar structures;
   a first barrier layer between the first end and the second end of the first pillar structure; and
   a second barrier layer between the top surface of the substrate and the gate conductor.

8. The semiconductor structure of claim 7, wherein the second end of the first pillar structure and a second end of a third pillar structure are coupled by a doped region above the first barrier layer.

9. The semiconductor structure of claim 7, wherein the second end of the first pillar structure and a second end of the second pillar structure are coupled by a doped region above the first barrier layer.

10. A semiconductor structure, comprising:
a substrate having a top surface;
a plurality of pillar structures formed on top of the substrate, each pillar structure of the plurality of pillar structures comprises a first end and a second end, wherein the first end is closer to the substrate than the second end;
a gate conductor surrounding each of the plurality of pillar structures disposed between the first end and the second end;
a drain/source region at the top surface of the substrate and in contact with the first end of a first pillar structure of the plurality of pillar structures;
a source/drain region at the top surface of the substrate and in contact with the first end of a second pillar structure of the plurality of pillar structures; and
a first shallow isolation region disposed in the substrate, wherein the first shallow isolation region is between a source via and the second pillar structure.

11. The semiconductor structure of claim 10, further comprising:
a second shallow isolation region disposed in the substrate, wherein the second shallow isolation region is between a drain via and the first pillar structure.

12. The semiconductor structure of claim 11, further comprising:
a shallow trench isolation region in the substrate;
a third pillar structure; and
a fourth pillar structure, the third pillar structure being disposed between the fourth pillar structure and the first pillar structure, the fourth pillar structure being disposed between the second pillar structure and the third pillar structure, the third pillar structure being coupled to the fourth pillar structure by a doped region above and separated from the top surface of the substrate, wherein the shallow trench isolation region is disposed between the fourth pillar structure and the third pillar structure.

13. A circuit, comprising:
a first vertical transistor comprising:
a first folded channel comprising a plurality of first pillar structures formed above a surface of the substrate, the first folded channel comprising a first path through the plurality of first pillar structures, the plurality of first pillar structures coupled in series;
a first gate conductor surrounding each of the plurality of first pillar structures;
a first drain/source region at the surface of the substrate and in contact with one of the plurality of first pillar structures; and
a first source/drain region at the surface of the substrate and in contact with another of the plurality of first pillar structures.

14. The circuit of claim 13, further comprising:
a second vertical transistor comprising:
a second folded channel comprising a plurality of second pillar structures formed above the surface of the substrate, the second folded channel comprising a second path through the plurality of second pillar structures, the plurality of second pillar structures coupled in series;
a second gate conductor surrounding each of the plurality of second pillar structures;
a second drain/source region at the surface of the substrate and in contact with one of the plurality of second pillar structures; and
a second source/drain region at the surface of the substrate and in contact with another of the plurality of second pillar structures.

15. The circuit of claim 14, wherein the first path is shorter than the second path by at least 25 percent.

16. The circuit of claim 14, wherein the first path comprises at least eight first pillar structures and the second path comprises less than eight second pillar structures.

17. The circuit of claim 13, wherein the first gate conductor encircles the plurality of pillar structures; and
wherein the first gate conductor does not surround a top and a bottom of each of the plurality of pillar structures.

18. A vertical transistor, comprising:
a semiconductor substrate having a top surface;
a plurality of pillar structures formed extending from the top surface, each pillar structure of the plurality of pillar structures comprises a first end and a second end, wherein the first end is closer to the semiconductor substrate than the second end;
a channel path disposed through the plurality of pillar structures and underneath a shallow trench isolation region in the substrate;
a gate conductor surrounding each of the plurality of pillar structures disposed between the first end and the second end;
a drain/source region at the top surface of the semiconductor substrate and in contact with the first end of a first pillar structure of the plurality of pillar structures; and
a source/drain region at the top surface of the semiconductor substrate and in contact with the first end of a second pillar structure of the plurality of pillar structures.

19. The vertical transistor of claim 18, wherein the shallow trench isolation region is disposed between two of the plurality of pillar structures.

20. The vertical transistor of claim 18, wherein the gate conductor encircles the plurality of pillar structures.

21. The vertical transistor of claim 18, wherein the gate conductor does not surround a top and a bottom of each of the plurality of pillar structures.

22. A vertical transistor, comprising:
a semiconductor substrate having a top surface;
a plurality of pillar structures formed extending from the top surface, each pillar structure of the plurality of pillar structures comprises a first end and a second end, wherein the first end is closer to the semiconductor substrate than the second end;
a gate conductor surrounding each of the plurality of pillar structures disposed between the first end and the second end;
a drain/source region at the top surface of the semiconductor substrate and in contact with the first end of a first pillar structure of the plurality of pillar structures;
a source/drain region at the top surface of the semiconductor substrate and in contact with the first end of a second pillar structure of the plurality of pillar structures;
a first barrier layer between the first end and the second end of the first pillar structure; and
a second barrier layer between the top surface of the semiconductor substrate and the gate conductor.

23. The vertical transistor of claim 22, wherein the second end of the first pillar structure and a second end of a third pillar structure are coupled by a doped region above the first barrier layer.

* * * * *